(12) United States Patent
Chen

(10) Patent No.: US 12,029,069 B2
(45) Date of Patent: Jul. 2, 2024

(54) DISPLAY MODULE AND FABRICATION METHOD THEREOF, AND DISPLAY DEVICE

(71) Applicant: BOE Technology Group Co., Ltd., Beijing (CN)

(72) Inventor: Yuju Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 404 days.

(21) Appl. No.: 17/486,754

(22) Filed: Sep. 27, 2021

(65) Prior Publication Data

US 2022/0157901 A1 May 19, 2022

(30) Foreign Application Priority Data

Nov. 18, 2020 (CN) .......................... 202011299962.3

(51) Int. Cl.
| | | |
|---|---|---|
| H10N 30/80 | (2023.01) | |
| B06B 1/06 | (2006.01) | |
| H10K 50/818 | (2023.01) | |
| H10K 59/00 | (2023.01) | |
| H10K 71/00 | (2023.01) | |
| H10N 30/045 | (2023.01) | |
| H10N 30/076 | (2023.01) | |
| H10N 30/082 | (2023.01) | |
| H10N 30/853 | (2023.01) | |
| H10N 30/87 | (2023.01) | |
| H10K 102/00 | (2023.01) | |

(52) U.S. Cl.
CPC ........... *H10K 59/00* (2023.02); *B06B 1/0622* (2013.01); *H10K 50/818* (2023.02); *H10K 71/00* (2023.02); *H10N 30/045* (2023.02); *H10N 30/076* (2023.02); *H10N 30/082* (2023.02); *H10N 30/8554* (2023.02); *H10N 30/877* (2023.02); *H10K 2102/00* (2023.02); *H10K 2102/3026* (2023.02)

(58) Field of Classification Search
CPC ............................ H10N 30/80; H10N 30/802
See application file for complete search history.

(56) References Cited

U.S. PATENT DOCUMENTS

| | | | |
|---|---|---|---|
| 11,387,802 B1 * | 7/2022 | Griffin | ............... H10N 30/1071 |
| 2021/0042493 A1 * | 2/2021 | Lius | ...................... G09G 3/3208 |
| 2023/0309360 A1 * | 9/2023 | Ueda | ...................... H05B 33/26 |

* cited by examiner

*Primary Examiner* — Jae Lee
(74) *Attorney, Agent, or Firm* — IPro, PLLC

(57) ABSTRACT

A display module and a fabrication method thereof, and a display device, and relates to the field of display technologies, to synchronously implement a display function and a surface tactile reproduction function. The display module includes: a base substrate, a plurality of piezoelectric structures positioned on a first side of the base substrate, and at least one isolation portion positioned on the first side of the base substrate and configured to separate any two adjacent piezoelectric structures. A pixel hole is arranged in at least one of three positions, i.e., a position of the piezoelectric structure, a position of the isolation portion, and a position between the piezoelectric structure and the isolation portion. The display module also includes a plurality of pixel structures, and each of the plurality of pixel structures is positioned in one of the pixel holes.

13 Claims, 6 Drawing Sheets

DISPLAY MODULE AND FABRICATION METHOD THEREOF, AND DISPLAY DEVICE

CROSS-REFERENCE TO RELATED APPLICATION

The present application claims the priority of the Chinese patent application filed on Nov. 18, 2020 before the Chinese Patent Office with the application number of 202011299962.3 and the title of "DISPLAY MODULE AND FABRICATION METHOD THEREOF, AND DISPLAY DEVICE", which is incorporated herein in its entirety by reference.

TECHNICAL FIELD

The present disclosure relates to the field of display technologies, and more particularly, to a display module and a fabrication method thereof, and a display device.

BACKGROUND

Haptics refers to interaction between a device terminal and a human body based on tactile sense. The haptics may be divided into two categories, i.e., vibration feedback, and surface tactile reproduction technology. According to the surface tactile reproduction technology, object characteristics (such as the tactile sense of different roughnesses and surface textures) may be sensed by touching screens with fingers, and efficient and natural interaction is implemented in a display terminal. This technology has a great research value, and thus it has attracted extensive attention from researchers at home and abroad.

SUMMARY

A display module and a fabrication method thereof, and a display device, to implement a display function and a surface tactile reproduction function.

The present disclosure provides following technical solutions.

One aspect of the present disclosure provides a display module. The display module includes: a base substrate, a plurality of piezoelectric structures positioned on a first side of the base substrate, and at least one isolation portion positioned on the first side of the base substrate and configured to separate any two adjacent piezoelectric structures. A pixel hole is arranged in at least one of three positions, i.e., a position of the piezoelectric structure, a position of the isolation portion, and a position between the piezoelectric structure and the isolation portion. The display module also includes a plurality of pixel structures, and each of the plurality of pixel structures is positioned in one of the pixel holes.

In some embodiments, the piezoelectric structure comprises a first electrode, a piezoelectric film, and a second electrode sequentially away from the base substrate. Each of at least a part of the pixel holes penetrates through the first electrode, the piezoelectric film, and the second electrode.

In some embodiments, a material of the piezoelectric film comprises lead zirconate titanate, and a thickness of the piezoelectric film is 1 μm to 2 μm.

In some embodiments, the first electrode comprises a titanium metal layer and a first platinum metal layer sequentially away from the base substrate, a thickness of the titanium metal layer is 9 nm to 11 nm, and a thickness of the first platinum metal layer is 90 nm to 110 nm. The second electrode comprises a second platinum metal layer, and a thickness of the second platinum metal layer is 45 nm to 55 nm.

In some embodiments, the display module further comprises: an insulating protection layer positioned on the first side of the base substrate, wherein the insulating protection layer at least covers a surface of the piezoelectric structure away from the base substrate and a side surface of the piezoelectric structure close to the pixel structure; and a connecting wire positioned on a side of the insulating protection layer away from the base substrate. The connecting wire electrically connects the second electrodes of the plurality of piezoelectric structures together through a via hole on the insulating protection layer.

In some embodiments, the pixel structure comprises a cathode, a light-emitting functional layer, and an anode sequentially away from the base substrate. The base substrate is a transparent base substrate, the piezoelectric structure, and the isolation portion both are lightproof in a direction perpendicular to the base substrate, and the anode comprises a reflective electrode.

In some embodiments, the reflective electrode may include an aluminum metal layer and a magnesium-silver alloy layer sequentially away from the light-emitting functional layer.

In some embodiments, the piezoelectric structures and the isolation portions are alternately arranged sequentially along a direction parallel to the base substrate.

In some embodiments, the display module also includes a packaging layer positioned on the first side of the base substrate. The packaging layer is configured to package the plurality of piezoelectric structures and the plurality of pixel structures on the base substrate.

In another aspect, a display device is provided. The display device includes the display module as described in any one of the above embodiments.

In still another aspect, there is provided a fabrication method of a display module. The fabrication method comprises: providing a base substrate; forming a plurality of piezoelectric structures on a first side of the base substrate; forming at least one isolation portion on the first side of the base substrate, the at least one isolation portion being configured to separate any two adjacent piezoelectric structures, wherein a pixel hole is arranged in at least one of three positions, i.e., a position of the piezoelectric structure, a position of the isolation portion, and a position between the piezoelectric structure and the isolation portion; and forming a plurality of pixel structures on the first side of the base substrate, each of the plurality of pixel structures being positioned in one of the pixel holes.

In some embodiments, the forming a plurality of piezoelectric structures on a first side of the base substrate comprises: forming a plurality of first electrodes on the first side of the base substrate; depositing a piezoelectric material on surfaces of the plurality of first electrodes away from the base substrate by means of a sputtering process, and annealing the piezoelectric materials; forming a plurality of second electrodes on a surface of the annealed piezoelectric material away from the plurality of first electrodes; and polarizing the annealed piezoelectric material after the plurality of second electrodes are formed, to form a plurality of piezoelectric films.

In some embodiments, the forming a plurality of piezoelectric structures on the first side of the base substrate comprises: etching the plurality of second electrodes to form a plurality of first openings where the plurality of piezoelectric films are exposed; etching portions of the plurality of piezoelectric films exposed by the plurality of first openings to form a plurality of second openings where the plurality of first electrodes are exposed; and etching portions of the plurality of first electrodes exposed by the plurality of second openings to form a plurality of third openings where the base substrate is exposed; wherein the first opening, the second opening and the third opening communicated sequentially form one of the pixel holes.

In some embodiments, after the piezoelectric structure is formed and before the pixel structure is formed, the fabrication method further comprises: forming an insulating protection layer on the first side of the base substrate, the insulating protection layer at least covering a surface of the piezoelectric structure away from the base substrate and a side surface of the piezoelectric structure close to the pixel structure; and etching the insulating protection layer to form a plurality of via holes where the plurality of second electrodes are exposed. After the pixel structure is formed, the fabrication method further comprises: forming a conductive connection film layer on a side of the insulating protection layer away from the base substrate, wherein the conductive connection film layer comprises a connecting wire connecting the plurality of second electrodes of the plurality of piezoelectric structures together through the plurality of via holes.

BRIEF DESCRIPTION OF THE DRAWINGS

To describe the technical solutions of the present disclosure more clearly, the accompanying drawings required for describing some embodiments of the present disclosure will be briefly introduced below. Apparently, the accompanying drawings in the following description are merely accompanying drawings of some embodiments of the present disclosure. To those of ordinary skills in the art, other accompanying drawings may also be derived from these accompanying drawings without creative efforts. In addition, the accompanying drawings in the following description may be regarded as schematic diagrams, and are not a limitation on the actual size of the product and the actual process of the method involved in the embodiment of the present disclosure.

DETAILED DESCRIPTION

Figure 1A:
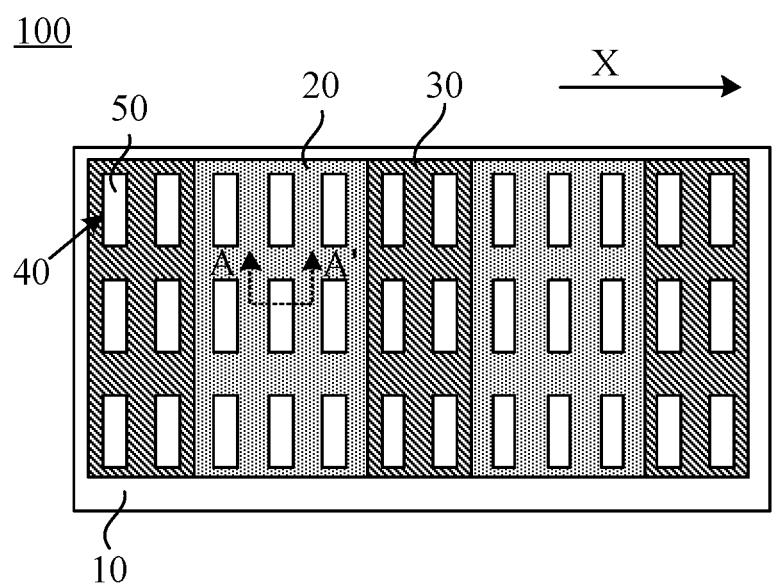
FIG. 1A is a structural diagram of a display module according to some embodiments.

Technical solutions in some embodiments of the present disclosure will be described clearly and completely below in conjunction with the accompanying drawings. Apparently, the described embodiments are some but not all of the embodiments of the present disclosure. On the basis of the embodiments provided by the present disclosure, all other embodiments obtained by those of ordinary skill in the art are within the scope of protection of the present disclosure.

Unless the context requires otherwise, throughout the specification and claims, the term "comprise" and other forms such as the singular form in third personal "comprises" and the present participle form "comprising" are interpreted to be open-ended and inclusive, i.e., to mean "including, but not limited to". In the description of the specification, the terms "one embodiment", "some embodiments", "exemplary embodiments", "example", "specific example" or "some examples" are intended to indicate that specific features, structures, materials, or characteristics related to this embodiment or example are included in at least one embodiment or example of the present disclosure. Schematic representations of the above terms do not necessarily refer to the same embodiment or example. In addition, the specific features, structures, materials, or characteristics described may be included in any one or more embodiments or examples in any suitable manner.

Hereinafter, terms "first" and "second" are used only for purposes of description and are not intended to indicate or imply relative importance or to imply the number of indicated technical features. Thus, the feature defined with "first" and "second" may explicitly or implicitly include at least one such feature. In the description of the embodiments of the present disclosure, "a plurality of" means two or more unless otherwise stated.

When some embodiments are described, expressions "coupled" and "connected" and derivatives thereof may be used. For example, the term "connected" may be used when describing some embodiments to indicate that two or more components are in direct physical or electrical contact with each other. For another example, the term "coupled" may be used when describing some embodiments to indicate that two or more components are in direct physical or electrical contact with each other. However, the term "coupled" or "communicatively coupled" may also mean that two or more components are not in direct contact with each other, but still coordinate or interact with each other. The embodiments disclosed herein are not necessarily limited to the content of the present disclosure.

The use of "adapted to" or "configured to" herein is meant as open-ended and inclusive language, which does not exclude devices adapted to or configured to perform additional tasks or steps.

Additionally, the use of "based on" is meant to be open-ended and inclusive, in that a process, step, calculation, or other action "based on" one or more recited conditions or values may, in practice, be based on additional conditions or value beyond those recited.

As used herein, "about", "approximate", and "approximately" include a stated value and an average value within an acceptable deviation range of a specified value. The acceptable deviation range is as determined by those of ordinary skill in the art in consideration of the measurement in question and the errors related to the measurement of a specific quantity (that is, limitations of the measurement system).

The exemplary embodiments are described herein with reference to cross-sectional views and/or plan views as idealized exemplary drawings. In the drawings, the thicknesses of layers and regions are exaggerated for clarity. Therefore, variations in shape relative to the drawings due to, for example, manufacturing techniques and/or tolerances may be envisaged. Therefore, the exemplary embodiments should not be interpreted as being limited to the shapes of the regions shown herein, but include shape deviations caused by, for example, manufacturing. For example, an etched region shown as a rectangle may generally have a curved feature. Therefore, the regions shown in the drawings are schematic in nature, and their shapes are not intended to show the actual shapes of the regions of the device, and are not intended to limit the scope of the exemplary embodiments.

Some embodiments of the present disclosure provide a display module 100. As shown in FIGS. 1A to 1E, the display module 100 includes a base substrate 10, a plurality of piezoelectric structures 20, and at least one isolation portion 30.

The plurality of piezoelectric structures 20 and the at least one isolation portion 30 are both positioned on a first side of the base substrate 10, and the at least one isolation portion 30 is configured to separate any two adjacent piezoelectric structures 20.

In some examples, as shown in FIGS. 1A to 1D, the piezoelectric structures 20 and the isolation portions 30 are alternately arranged sequentially along a direction X parallel to the base substrate 10. At this moment, there is one isolation portion 30 between every two adjacent piezoelectric structures 20. That is, every two adjacent piezoelectric structures 20 may be separated by the one isolation portion 30. In other examples, as shown in FIG. 1E, only one isolation portion 30 may be arranged on the first side of the base substrate 10, and any two adjacent piezoelectric structures 20 among the plurality of piezoelectric structures may be separated by the one isolation portion 30.

On this basis, exemplarily, the plurality of piezoelectric structures 20 may be arranged in an array on the first side of the base substrate 10. Thus, the plurality of piezoelectric structures 20 may be evenly distributed on the first side of the base substrate 10.

With continued reference to FIG. 1A to FIG. 1E, in the display module 100, a pixel hole 40 is arranged in at least one of three positions, i.e., a position of the piezoelectric structure 20, a position of the isolation portion 30, and a position between the piezoelectric structure 20 and the isolation portion 30.

Figure 1B:
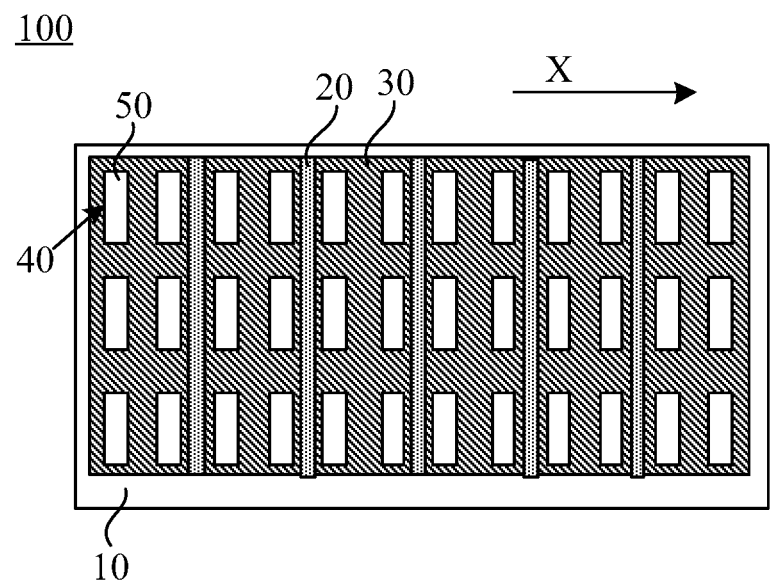
FIG. 1B is a structural diagram of another display module according to some embodiments.
Figure 1C:
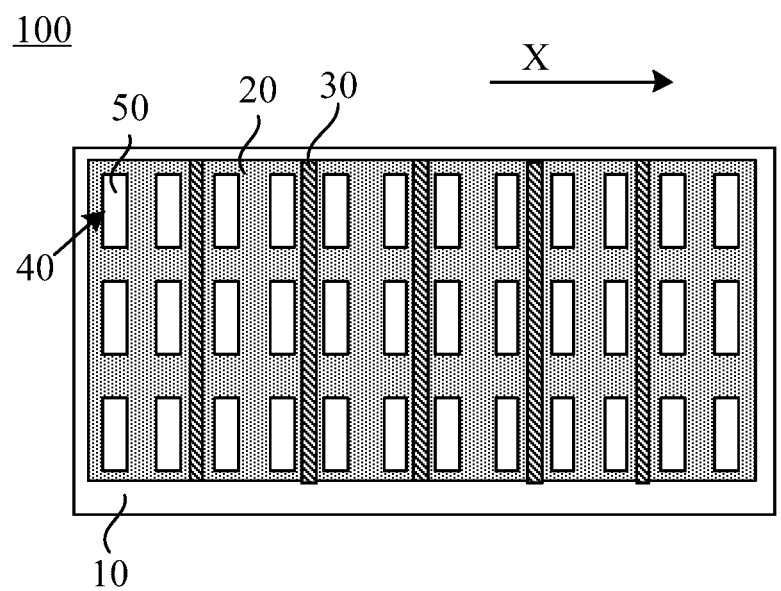
FIG. 1C is a structural diagram of still another display module according to some embodiments.
Figure 1D:
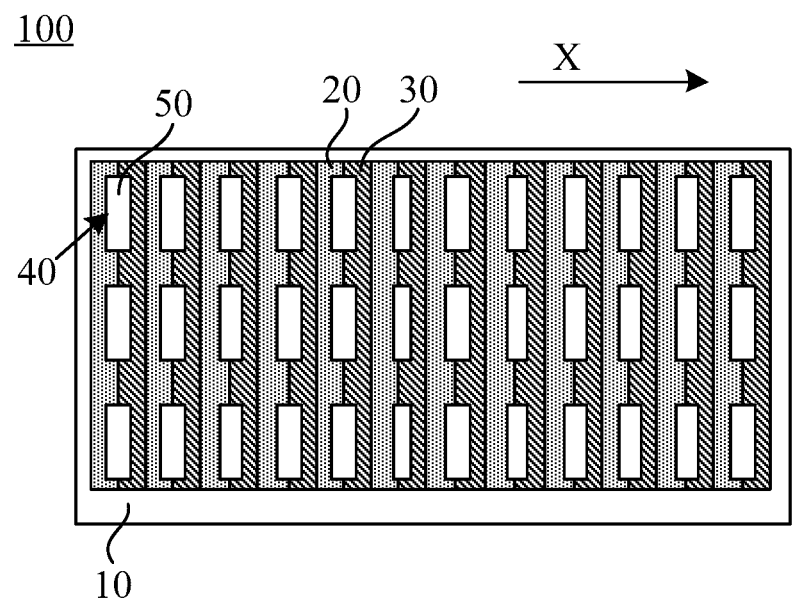
FIG. 1D is a structural diagram of still another display module according to some embodiments.
Figure 1E:
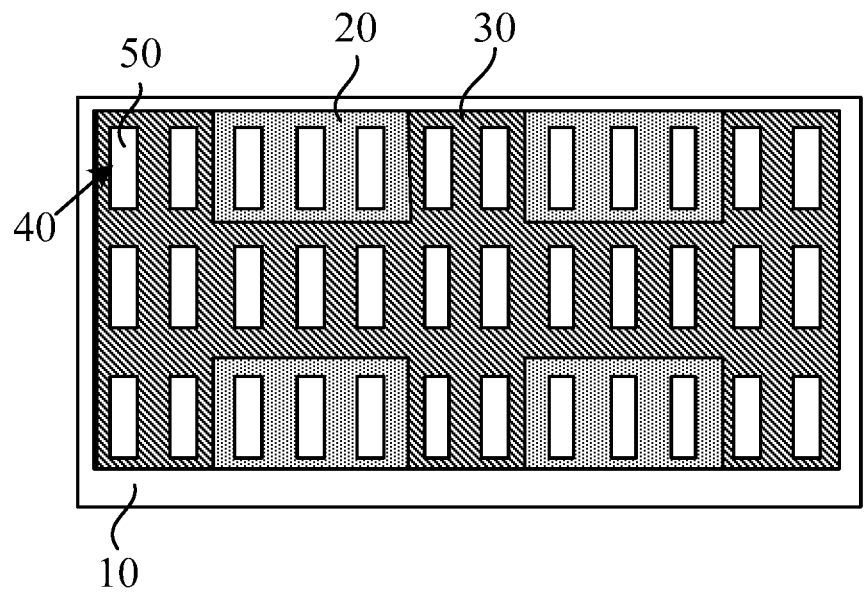
FIG. 1E is a structural diagram of still another display module according to some embodiments.

For example, as shown in FIG. 1A and FIG. 1E, a plurality of pixel holes 40 may be synchronously arranged on the piezoelectric structure 20 and the isolation portion 30. For another example, as shown in FIG. 1B, a plurality of pixel holes 40 may also be arranged only on the isolation portion 30. For still another example, as shown in FIG. 1C, a plurality of pixel holes 40 may also be arranged only on the piezoelectric structures 20. For still another example, as shown in FIG. 1D, a plurality of pixel holes 40 may also be arranged only between the piezoelectric structures 20 and the isolation portion 30. It may be understood that the above are only some embodiments of the present disclosure, and in actual products, the pixel holes 40 at the three positions as shown in FIG. 1B, FIG. 1C and FIG. 1D may be arbitrarily combined according to requirements.

On this basis, with continued reference to FIGS. 1A to 1E, the display module 100 further includes a plurality of pixel structures 50. Each of the plurality of pixel structures 50 is positioned in one of the pixel holes 40.

Based on this arrangement, the piezoelectric structures 20 and the pixel structures 50 may be well integrated, such that the display module 100 has both the display function and the surface tactile reproduction function.

In physical sense, surface tactile sense comes from an acting force generated between a surface of skin (e.g., a fingertip) and a surface of an object, and different frictions are formed due to different object surface structures (e.g., different textures). Therefore, by controlling the surface frictions, different tactile effects can be achieved.

In the above-mentioned display module 100, each piezoelectric structure 20 may cause the base substrate 10 to generate ultrasonic vibration in different degrees under the control of different driving voltages. Therefore, when a finger approaches a surface of a second side (that is, the side opposite to the first side of the base substrate 10) of the base substrate 10, an air film may be generated between the base substrate 10 and the finger. At this moment, a friction of the air film may be controlled by changing the driving voltages applied to each piezoelectric structure 20, such that tactile sense of the finger may be changed to implement the surface tactile reproduction function.

Exemplarily, the above-mentioned display module 100 may be a bottom light emitting display module. At this moment, the base substrate 10 is a transparent base substrate (for example, a glass base substrate). Both the piezoelectric structure 20 and the isolation portion 30 are lightproof in a direction perpendicular to the base substrate 10. That is, the piezoelectric structure 20 and the isolation portion 30 also have a light-shielding function, such that when the plurality of pixel structures 50 emit light, light rays emitted from adjacent pixel structures 50 are less prone to crosstalk, which is beneficial to improving a display effect.

For a color display mode, every three adjacent pixel structures 50 may be set as one pixel unit. It may be understood that colors of the light rays emitted from the three pixel structures 50 in each pixel unit may be the same or may be different.

When the colors of the light rays emitted from the three pixel structures 50 in each pixel unit are different, the three pixel structures 50 are respectively configured to emit tri-phosphor light rays (such as red light rays, green light rays, and blue light rays), such that the display module 100 can implement a color display function.

When the colors of the light rays emitted from the three pixel structures 50 in each pixel unit are the same, exemplarily, a color film may be arranged on a second side of the base substrate 10, such that when the three pixel structures 50 emit light rays having the same color, the light rays having the same color may emit tri-phosphor light rays after passing through the color film. In this way, the display module 100 can implement the color display function.

Figure 2:
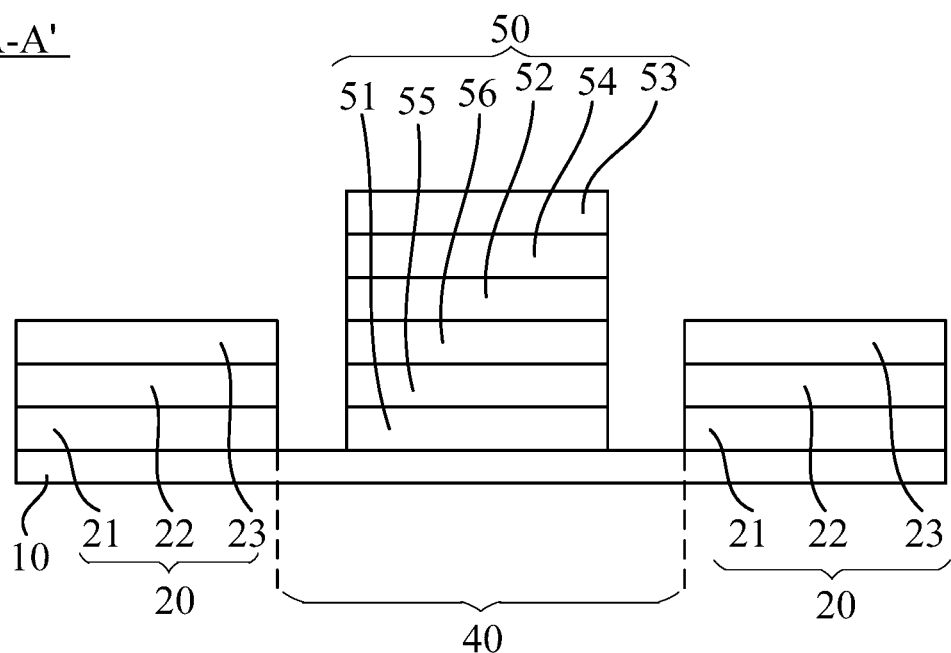
FIG. 2 is a sectional view of the module shown in FIG. 1A at the position A-A'.

In some embodiments, referring to FIG. 2, the pixel structure 50 includes a cathode 51, a light-emitting functional layer 52, and an anode 53 sequentially away from the base substrate. The light-emitting functional layer 52 may be, for example, an organic light-emitting diode light-emitting functional layer, a quantum dot light-emitting functional layer, or the like.

The anode 53 may include a reflective electrode. In this way, part of the light rays emitted from the light-emitting functional layer 52 toward the anode 53 may be reflected by the anode 53 toward the base substrate 10, which is conducive to enhancing brightness of light.

On this basis, exemplarily, the pixel structure 50 may further include an electron transport layer 54 between the anode 53 and the light-emitting functional layer 52, a hole transport layer 56 between the cathode 51 and the light-emitting functional layer 52, and a hole injection layer 55 between the hole transport layer 56 and the cathode 51. In this way, the injection amounts of holes and electrons can be improved, which is conducive to enhancing the luminous brightness of the light-emitting functional layer.

The reflective electrode may include an aluminum metal layer and a magnesium-silver alloy layer sequentially away from the light-emitting functional layer 52. In some examples, a thickness of the aluminum metal layer may be approximately 100 nm, and a thickness of the magnesium-silver alloy layer may be approximately 10 nm. Here, "approximately" may mean, for example, a fluctuation of 10% based on the stated value.

Some implementations of the piezoelectric structure 20 will be described below with reference to some examples.

In some embodiments, referring to FIG. 2, the piezoelectric structure 20 includes a first electrode 21, a piezoelectric film 22, and a second electrode 23 sequentially away from the base substrate 10. At this moment, by inputting different voltages to the first electrode 21 and the second electrode 23 respectively, the piezoelectric film 22 may vibrate, and the piezoelectric films 22 of the plurality of piezoelectric structures 20 may vibrate at different amplitudes, such that an air film may be formed on the second side of the base substrate 10. In this way, the surface tactile reproduction function is implemented.

Exemplarily, in the display module 100, each of at least a part of the pixel holes 40 penetrates through the first electrode 21, the piezoelectric film 22, and the second electrode 23. It should be noted that the at least a part of the pixel holes 40 may refer to all the pixel holes 40 in the display module 100, or may refer to one pixel hole 40 among all the pixel holes 40, or may refer to two or more pixel holes 40 among all the pixel holes 40.

It should be noted that the present disclosure does not limit the number of pixel holes 40 penetrating through the piezoelectric structure 20 (that is, the first electrode 21, the piezoelectric film 22, and the second electrode 23). That is, the number of pixel holes 40 penetrating through the piezoelectric structures 20 may be determined according to a size and a position of each piezoelectric structure 20. As shown in FIG. 1B, the number of pixel holes 40 penetrating through the piezoelectric structure 20 may also be zero.

Exemplarily, the material of the piezoelectric film 22 may include lead zirconate titanate, and a thickness of the piezoelectric film 22 may be 1 µm to 2 µm. For example, the thickness of the piezoelectric film 22 may be 1 µm, 1.2 µm, 1.6 µm, 1.8 µm or 2 µm, etc.

Exemplarily, the first electrode 21 may include a titanium metal layer and a first platinum metal layer sequentially away from the base substrate, and a thickness of the titanium metal layer may be 9 nm to 11 nm (for example, the thickness of the titanium metal layer may be 9 nm, 10 nm or 11 nm, etc.), and a thickness of the first platinum metal layer may be 90 nm to 110 nm (for example, the thickness of the first platinum metal layer may be 90 nm, 100 nm or 110 nm, etc.).

Exemplarily, the second electrode 23 may include a second platinum metal layer, and a thickness of the second platinum metal layer is 45 nm to 55 nm (for example, the thickness of the second platinum metal layer may be 45 nm, 50 nm or 55 nm, etc.).

Figure 3:
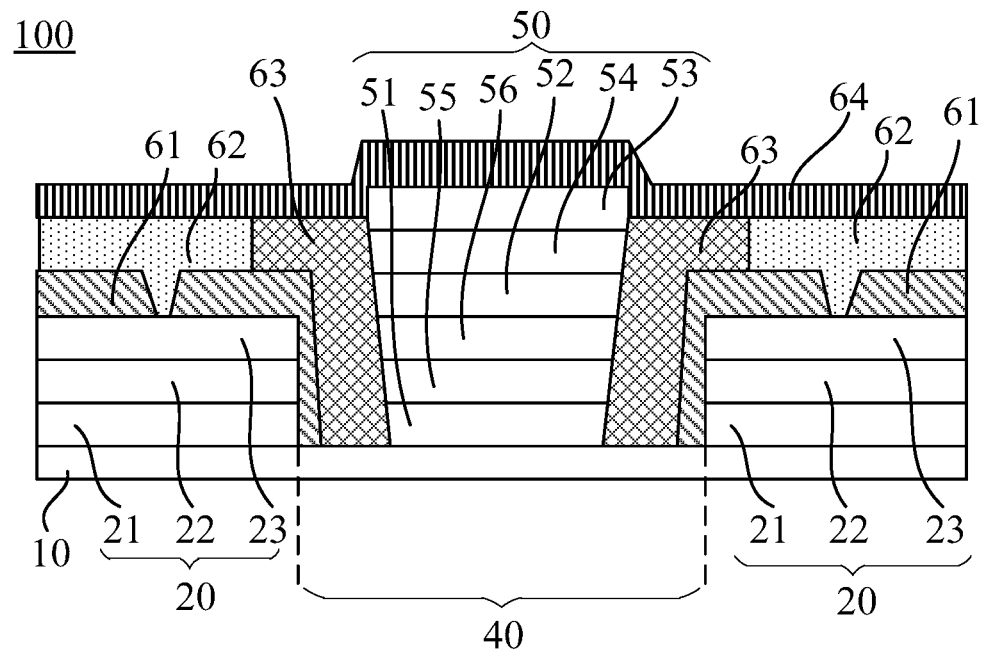
FIG. 3 is a sectional structural diagram of a display module according to some embodiments.

In some embodiments, as shown in FIG. 3, the display module 100 further includes an insulating protection layer 61 positioned on the first side of the base substrate 10, the insulating protection layer 61 at least covers a surface of the piezoelectric structure 20 away from the base substrate 10 and a side surface of the piezoelectric structure 20 close to the pixel structure 50. Based on this arrangement, the piezoelectric structure 20 may be protected by the insulating protection layer 61, and the piezoelectric structure 20 may be separated from the pixel structure 50 by the insulating protection layer 61, such that short circuits are not prone to occur between the piezoelectric structure 20 and the pixel structure 50.

A material of the insulating protection layer 61 may include silicon dioxide. A thickness of the insulating protection layer 61 may be approximately 100 nm. Here, "approximately" may mean, for example, a fluctuation of 10% based on the stated value.

On this basis, exemplarily, as shown in FIG. 3, the display module 100 further includes a connecting wire 62 positioned on a side of the insulating protection layer 61 away from the base substrate, and the connecting wire 62 electrically connects the second electrodes 23 of the plurality of piezoelectric structures 20 together through via holes on the insulating protection layer 61.

Exemplarily, the first electrodes 21 of the plurality of piezoelectric structures 20 may be connected to different driving circuits, to implement control of the plurality of piezoelectric structures 20.

The connecting wire 62 may include a titanium metal layer and an aluminum metal layer sequentially away from the base substrate. A thickness of the titanium metal layer may be approximately 10 nm and a thickness of the aluminum metal layer may be approximately 100 nm.

It should be noted that the connecting wire 62 is positioned in a conductive connection film layer, and the conductive connection film layer may be fabricated after the pixel structure 50 is fabricated (that is, the anode 53 of the pixel structure 50 is fabricated). In addition, the conductive connection film layer may include other signal wires (e.g., wires connected to the anode 53 of the pixel structure 50) in addition to the connecting wires 62.

The fabrication process of the light-emitting functional layer 52 includes, but is not limited to, a vapor deposition process and an inkjet printing process.

If the light-emitting functional layer 52 is fabricated by means of the inkjet printing, exemplarily, as shown in FIG. 3, the display module 100 further includes a pixel defining layer 63. The pixel defining layer 63 may be fabricated after the insulating protection layer 61 is fabricated. Therefore, in some examples, the insulating protection layer 61, the pixel defining layer 63, the pixel structure 50, and the conductive connection film layer (including the connecting wire 62) may be sequentially fabricated.

Exemplarily, a thickness of the pixel defining layer 63 in the direction perpendicular to the base substrate 10 may be approximately 1.5 times that of the piezoelectric film 22. Here, "approximately" may mean, for example, a fluctuation of 10% based on the stated value.

If the light-emitting functional layer 52 is formed by means of the vapor deposition process, the step of fabricating the pixel defining layer 63 may be omitted.

On the basis of some of the above embodiments, exemplarily, as shown in FIG. 3, the display module 100 may further include a packaging layer 64. The packaging layer 64 is positioned on the first side of the base substrate 10, and the packaging layer 64 is configured to package the plurality of piezoelectric structures 20 and the plurality of pixel structures 50 on the base substrate 10.

Figure 4:
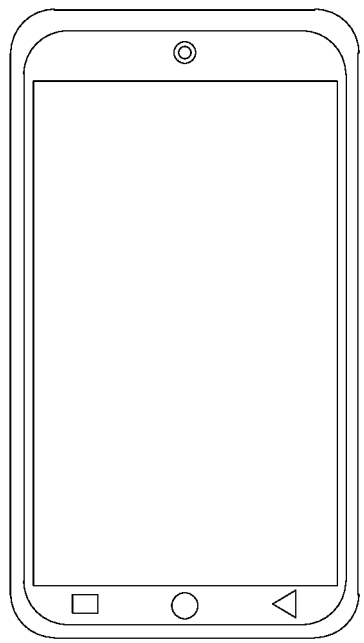
FIG. 4 is a structural diagram of a display device according to some embodiments.

FIG. 4 is a structural diagram of a display device 200 according to some embodiments of the present disclosure. The display device 200 provided by some embodiments of the present disclosure includes the display module provided by any of the above embodiments.

The display device 200 may be, for example, a television, a digital camera, a mobile phone, a watch, a tablet computer, a notebook computer, a navigator, and any other components with display functions.

The beneficial effects of the display device 200 provided by the present disclosure are the same as those of the touch control structure 100 provided by the above technical solutions, and thus are not to be described here.

Figure 5:
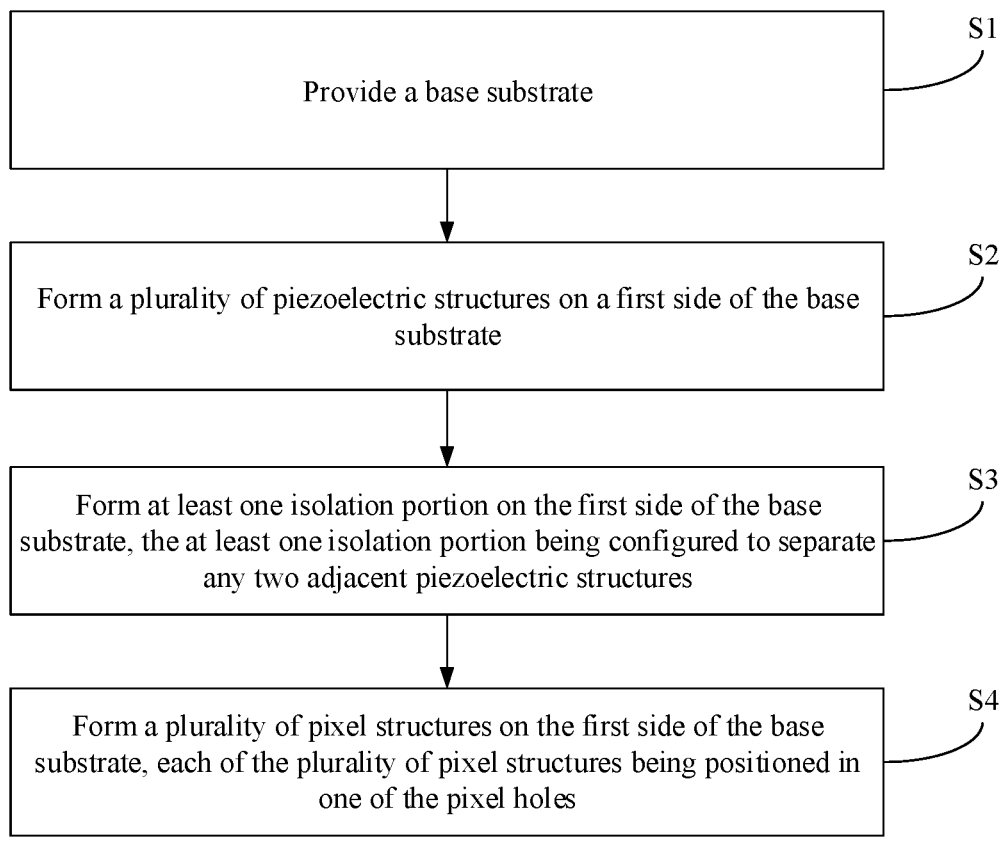
FIG. 5 is a flowchart of a fabrication method of a display module according to some embodiments.

Some embodiments of the present disclosure provide a fabrication method of a display module. Referring to FIG. 1A and FIG. 5, the fabrication method includes the following steps.

Step S1: providing a base substrate 10.

Step S2: forming a plurality of piezoelectric structures 20 on a first side of the base substrate 10.

Step S3: forming at least one isolation portion 30 on the first side of the base substrate 10, the at least one isolation portion 30 being configured to separate any two adjacent piezoelectric structures 20. A pixel hole 40 is arranged in at least one of three positions, i.e., a position of the piezoelectric structure 20, a position of the isolation portion 30, and a position between the piezoelectric structure 20 and the isolation portion 30.

Step S4: forming a plurality of pixel structures 50 on the first side of the base substrate 10, each of the plurality of pixel structures 50 being positioned in one of the pixel holes 40. The plurality of pixel structures 50 may be formed by means of a deposition process and/or the vapor deposition process.

Through the display module 100 formed by the above Steps S1 to S4, the piezoelectric structure 20 and the pixel structure 50 may be well integrated, such that the display module 100 has both the display function and the surface tactile reproduction function.

Figure 6:
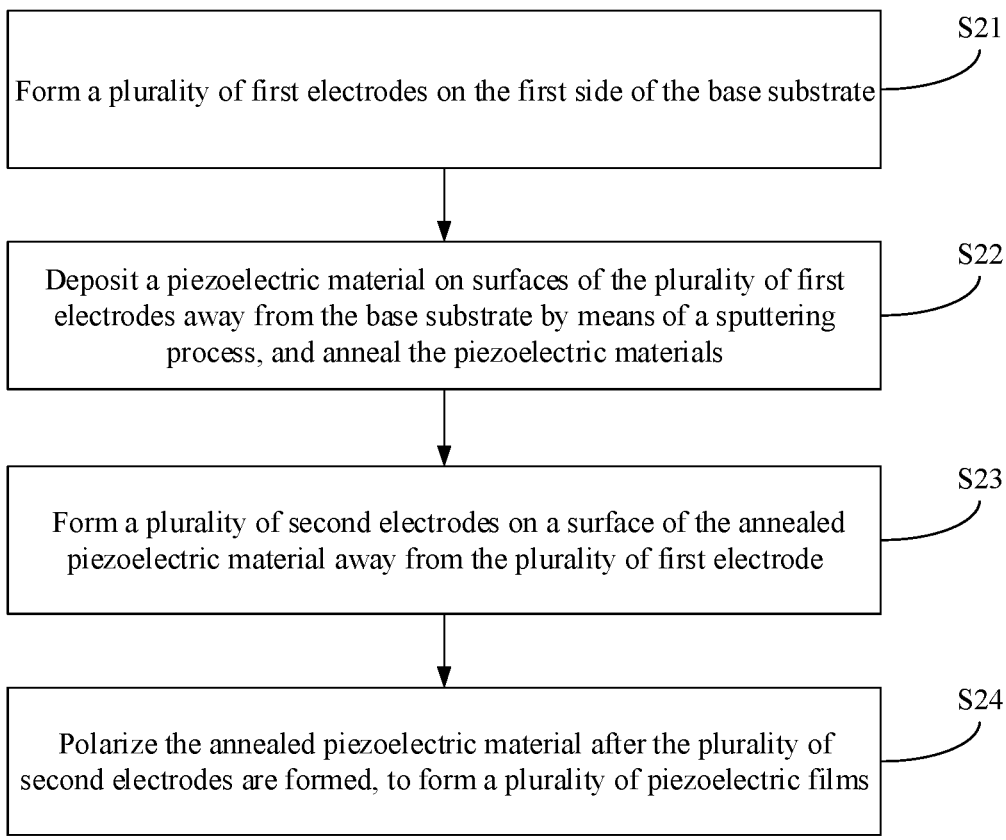
FIG. 6 is a flowchart of fabrication method of another display module according to some embodiments.

In some examples, referring to FIG. 2 and FIG. 6, the Step S2 of forming the plurality of piezoelectric structures 20 on a first side of the base substrate 10 includes the following steps.

Step S21: forming a plurality of first electrodes 21 on the first side of the base substrate 10.

The first electrode 21 may include a titanium metal layer and a first platinum metal layer sequentially away from the base substrate. The thickness of the titanium metal layer may be 9 nm to 11 nm (for example, the thickness of the titanium metal layer may be 9 nm, 10 nm or 11 nm, etc.), and the thickness of the first platinum metal layer may be 90 nm to 110 nm (for example, the thickness of the first platinum metal layer may be 90 nm, 100 nm, 110 nm, etc.).

Step S22: depositing a piezoelectric material on surfaces of the plurality of first electrodes 21 away from the base substrate 10 by means of a sputtering process, and annealing the piezoelectric materials.

The piezoelectric materials may be lead zirconate titanate.

An ambient temperature of the annealing treatment may be 550-650 degrees (for example, 550 degrees, 600 degrees, 650 degrees, etc.), and annealing time may be 30-60 minutes (for example, 30 minutes, 40 minutes, 60 minutes, etc.).

Step S23: forming a plurality of second electrodes 23 on a surface of the annealed piezoelectric material away from the plurality of first electrode 21.

The second electrode 23 may include a second platinum metal layer, and a thickness of the second platinum metal layer is 45 nm to 55 nm (for example, the thickness of the second platinum metal layer may be 45 nm, 50 nm, 55 nm, etc.).

Step S24: polarizing the annealed piezoelectric material after the plurality of second electrodes 23 are formed, to form a plurality of piezoelectric films 22.

An ambient temperature of the polarization treatment may be approximately 120 degrees. Duration of the polarization treatment may be approximately 4 hours. Here, "approximately" may mean, for example, a fluctuation of 10% based on the stated value.

Exemplarily, the thickness of the piezoelectric film may be 1 μm to 2 μm.

Here, it is worth pointing out that the piezoelectric film fabricated by the above process is thin, so it may be well integrated into the display module, such that the display module can implement both the display function and the surface tactile reproduction function.

Figure 7:
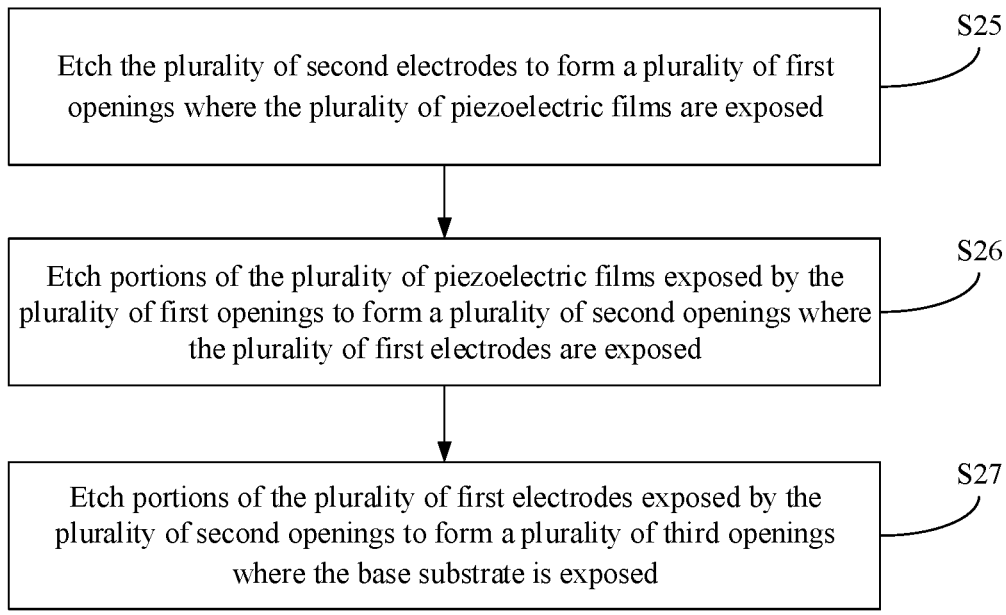
FIG. 7 is a flowchart of fabrication method of still another display module according to some embodiments.

On the basis of some examples mentioned above, referring to FIGS. 2 and 7, and step S2, the forming the plurality of piezoelectric structures 20 on the first side of the base substrate 10 may further include the following steps.

Step S25: etching the plurality of second electrodes 23 to form a plurality of first openings where the plurality of piezoelectric films 22 are exposed.

For example, the plurality of second electrodes 23 may be etched by means of an ion beam etching (IBE) process.

Step S26: etching portions of the plurality of piezoelectric films 22 exposed by the plurality of first openings to form a plurality of second openings where the plurality of first electrodes 21 are exposed.

For example, the plurality of piezoelectric films 22 may be etched by means of a reaction ion etching (RIE) process.

Step S27: etching portions of the plurality of first electrodes 21 exposed by the plurality of second openings to form a plurality of third openings where the base substrate 10 is exposed.

For example, the plurality of first electrodes 21 may be etched by means of the IBE process.

The first opening, the second opening and the third opening communicated sequentially forms one pixel hole 40.

In addition, when there is a pixel hole 40 on the isolation portion 30, the pixel hole 40 on the isolation portion 30 may also be formed by etching the material forming the isolation portion 30.

In some embodiments, referring to FIG. 2, after the piezoelectric structure 20 is formed and before the pixel structure 50 is formed, the fabrication method further includes:

forming an insulating protection layer 61 on the first side of the base substrate 10, the insulating protection layer 61 at least covering a surface of the piezoelectric structure 20 away from the base substrate 10 and a side surface of the piezoelectric structure 20 close to the pixel structure 50. A material of the insulating protection layer 61 may include silicon dioxide. A thickness of the insulating protection layer 61 may be approximately 100 nm. Here, "approximately" may mean, for example, a fluctuation of 10% based on the stated value.

The insulating protection layer 61 is etched to form a plurality of via holes where the plurality of second electrodes 23 are exposed.

After the pixel structure 50 is formed, the fabrication method further comprises:

forming a conductive connection film layer on a side of the insulating protection layer 61 away from the base substrate 10, the conductive connection film layer comprising a connecting wire 62 connecting the plurality of second electrodes of the plurality of piezoelectric structures together through the plurality of via holes.

The connecting wire 62 may include a titanium metal layer and an aluminum metal layer sequentially away from the base substrate. The thickness of the titanium metal layer may be approximately 10 nm, and the thickness of the aluminum metal layer may be approximately 100 nm.

After that, the fabrication method may further include a step of fabricating a packaging layer, the packaging layer 64 is positioned on the first side of the base substrate 10, and the packaging layer 64 is configured to package the plurality of piezoelectric structures 20 and the plurality of pixel structures 50 on the base substrate 10.

The abovementioned embodiments are merely specific embodiments of the present disclosure, but the protection scope of the present disclosure is not limited thereto. Any variation or substitution easily conceivable to a person of ordinary skills in the art within the technical scope disclosed in the present disclosure shall fall into the protection scope of the present disclosure. Therefore, the protection scope of the present disclosure shall be subject to the protection scope of the claims.

The invention claimed is:

1. A display module, comprising:
   a base substrate;
   a plurality of piezoelectric structures positioned on a first side of the base substrate; and
   at least one isolation portion positioned on the first side of the base substrate and configured to separate any two adjacent piezoelectric structures;
   wherein a pixel hole is arranged in at least one of three positions, i.e., a position of the piezoelectric structure, a position of the isolation portion, and a position between the piezoelectric structure and the isolation portion; and
   the display module further comprises a plurality of pixel structures, each of the plurality of pixel structures being positioned in one of the pixel holes;
   wherein the piezoelectric structure comprises a first electrode, a piezoelectric film, and a second electrode sequentially away from the base substrate;
   wherein each of at least a part of the pixel holes penetrates through the first electrode, the piezoelectric film, and the second electrode;
   wherein the display module further comprises:
     an insulating protection layer positioned on the first side of the base substrate, the insulating protection layer at least covering a surface of the piezoelectric structure away from the base substrate and a side surface of the piezoelectric structure close to the pixel structure; and
     a connecting wire positioned on a side of the insulating protection layer away from the base substrate, the connecting wire electrically connecting the second electrodes of the plurality of piezoelectric structures together through a via hole on the insulating protection layer.

2. The display module according to claim 1, wherein a material of the piezoelectric film comprises lead zirconate titanate, a thickness of the piezoelectric film being 1 μm to 2 μm.

3. The display module according to claim 1, wherein the first electrode comprises a titanium metal layer and a first platinum metal layer sequentially away from the base substrate, a thickness of the titanium metal layer being 9 nm to 11 nm, and a thickness of the first platinum metal layer being 90 nm to 110 nm; and/or,
the second electrode comprises a second platinum metal layer, and a thickness of the second platinum metal layer being 45 nm to 55 nm.

4. The display module according to claim 1, wherein the pixel structure comprises a cathode, a light-emitting functional layer, and an anode sequentially away from the base substrate;
   wherein the base substrate is a transparent base substrate, the piezoelectric structure and the isolation portion both being lightproof in a direction perpendicular to the base substrate, and the anode comprising a reflective electrode.

5. The display module according to claim 4, wherein the reflective electrode comprises an aluminum metal layer and a magnesium-silver alloy layer sequentially away from the light-emitting functional layer.

6. The display module according to claim 1, wherein the piezoelectric structures and the isolation portions are alternately arranged sequentially along a direction parallel to the base substrate.

7. The display module according to claim 1, further comprising:
   a packaging layer positioned on the first side of the base substrate, the packaging layer being configured to package the plurality of piezoelectric structures and the plurality of pixel structures on the base substrate.

8. A display device, comprising:
   the display module according to claim 1.

9. The display device according to claim 8, wherein the pixel structure comprises a cathode, a light-emitting functional layer, and an anode sequentially away from the base substrate;
   wherein the base substrate is a transparent base substrate, the piezoelectric structure, and the isolation portion both being lightproof in a direction perpendicular to the base substrate, and the anode comprising a reflective electrode.

10. The display device according to claim 8, wherein a material of the piezoelectric film comprises lead zirconate titanate, a thickness of the piezoelectric film being 1 μm to 2 μm.

11. The display device according to claim 8, wherein the first electrode comprises a titanium metal layer and a first platinum metal layer sequentially away from the base substrate, a thickness of the titanium metal layer being 9 nm to 11 nm, and a thickness of the first platinum metal layer being 90 nm to 110 nm; and/or,
the second electrode comprises a second platinum metal layer, and a thickness of the second platinum metal layer being 45 nm to 55 nm.

12. A fabrication method of a display module, comprising:
   providing a base substrate;
   forming a plurality of piezoelectric structures on a first side of the base substrate;
   forming at least one isolation portion on the first side of the base substrate, the at least one isolation portion being configured to separate any two adjacent piezoelectric structures, wherein a pixel hole is arranged in at least one of three positions, i.e., a position of the piezoelectric structure, a position of the isolation portion, and a position between the piezoelectric structure and the isolation portion; and
   forming a plurality of pixel structures on the first side of the base substrate, each of the plurality of pixel structures being positioned in one of the pixel holes;
   wherein the forming a plurality of piezoelectric structures on a first side of the base substrate comprises:

forming a plurality of first electrodes on the first side of the base substrate;

depositing a piezoelectric material on surfaces of the plurality of first electrodes away from the base substrate by means of a sputtering process, and annealing the piezoelectric materials;

forming a plurality of second electrodes on a surface of the annealed piezoelectric material away from the plurality of first electrodes; and polarizing the annealed piezoelectric material after the plurality of second electrodes are formed, to form a plurality of piezoelectric films;

wherein after the piezoelectric structure is formed and before the pixel structure is formed, the fabrication method further comprises:

forming an insulating protection layer on the first side of the base substrate, the insulating protection layer at least covering a surface of the piezoelectric structure away from the base substrate and a side surface of the piezoelectric structure close to the pixel structure; and etching the insulating protection layer to form a plurality of via holes where the plurality of second electrodes are exposed; and after the pixel structure is formed, the fabrication method further comprises:

forming a conductive connection film layer on a side of the insulating protection layer away from the base substrate, the conductive connection film layer comprising a connecting wire connecting the plurality of second electrodes of the plurality of piezoelectric structures together through the plurality of via holes.

13. The method fabrication method according to claim 12, wherein the forming a plurality of piezoelectric structures on the first side of the base substrate comprises:

etching the plurality of second electrodes to form a plurality of first openings where the plurality of piezoelectric films are exposed;

etching portions of the plurality of piezoelectric films exposed by the plurality of first openings to form a plurality of second openings where the plurality of first electrodes are exposed; and etching portions of the plurality of first electrodes exposed by the plurality of second openings to form a plurality of third openings where the base substrate is exposed;

wherein the first opening, the second opening and the third opening communicated sequentially form one of the pixel holes.

* * * * *